United States Patent
Campbell et al.

(10) Patent No.: US 6,863,576 B2
(45) Date of Patent: Mar. 8, 2005

(54) ELECTRICAL TEST PROBE FLEXIBLE SPRING TIP

(75) Inventors: Julie A. Campbell, Beaverton, OR (US); Lawrence W. Jacobs, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/020,707

(22) Filed: Dec. 13, 2001

(65) Prior Publication Data

US 2002/0052155 A1 May 2, 2002

Related U.S. Application Data

(63) Continuation of application No. PCT/US01/24017, filed on Jul. 30, 2001, which is a continuation of application No. 09/895,060, filed on Jun. 29, 2001, now abandoned.
(60) Provisional application No. 60/221,716, filed on Jul. 31, 2000.

(51) Int. Cl.[7] .............................................. H01R 13/24
(52) U.S. Cl. ....................................... 439/700; 439/824
(58) Field of Search ................................ 439/700, 824, 439/66, 482

(56) References Cited

U.S. PATENT DOCUMENTS

| | | | |
|---|---|---|---|
| 3,072,877 A | 5/1961 | Landwehr | |
| 3,676,776 A | 7/1972 | Bauer et al. | |
| 3,885,848 A | 5/1975 | Brouneus | |
| 4,740,746 A | 4/1988 | Pollock et al. | |
| 4,773,877 A | 9/1988 | Kruger et al. | |
| 4,978,312 A | 12/1990 | Fodali | |
| 5,151,040 A | * 9/1992 | Tanaka | 439/824 |
| 5,967,856 A | 10/1999 | Meller | |
| 5,982,187 A | 11/1999 | Tarzwell | |
| 5,997,360 A | 12/1999 | Gen-Kuong et al. | |
| 6,083,059 A | 7/2000 | Kuan | |
| 6,447,343 B1 | * 9/2002 | Zhang et al. | 439/700 |
| 6,464,511 B1 | * 10/2002 | Watanabe et al. | 439/700 |

OTHER PUBLICATIONS

Tektronix, Instruction Manual, P6245, 1.5 GHz 10X Active Probe, 070–8995–01, Tektronix, Inc., Wilsonville, Oregon, USA.

* cited by examiner

*Primary Examiner*—Gary Paumen
(74) *Attorney, Agent, or Firm*—Karen Dana Oster

(57) ABSTRACT

An electrical test probe tip, comprising a conductive flexible coil having a first end and a second end. The first end is for flexibly coupling with a device to be probed. The second end is attached to a connector. The connector may be an integral connection with a probing head or may be a connecting pin. Multiple test probe spring tips may be used to simultaneously probe signal and ground reference points. The present invention is also directed to a method for using the flexible spring tip.

37 Claims, 4 Drawing Sheets

54 — Attach connector end of flexible tip to probing head.

70 — Make at least one flexible electrical ground connection.

56 — Place contact end of flexible tip in electrical contact with electrical component.

58 — Create access space by flexing the flexible tip.

60 — Improve visibility of components.

62 — Make additional electrical connections with another flexible or inflexible tip on the same probing head.

64 — Make electrical connections using at least one other probing head.

66 — Introduce other test equipment into access space created by flexing the tip.

68 — Introduce mechanical tools into access space created by flexing the tip.

FIG. 15

ELECTRICAL TEST PROBE FLEXIBLE SPRING TIP

The present application is a continuation of Patent Cooperation Treaty (PCT) application No. PCT/US01/24017, filed Jul. 30, 2001; PCT Application No. PCT/US01/24017 is a continuation of U.S. patent application Ser. No. 09/895,060, filed Jun. 29, 2001 (now abandoned); and U.S. patent application Ser. No. 09/895,060 is an application claiming the benefit under 35 USC Section 119 (e) of U.S. Provisional Patent Application No. 60/221,716, filed Jul. 31, 2000.

BACKGROUND OF INVENTION

The present invention relates to an electrical test probe tip for use with testing instruments, and more particularly to an electrical test probe flexible coil or spring tip.

An electrical test probe generally consists of a probing head with a tip, a cable, and a connector for attaching the cable to test instruments. The probing head may have an integral or replaceable probing tip that is suitable for making an electrical contact with electrical components. The probing head is attached to a first end of the cable and the test instrument connector is attached to the opposite end of the cable. A means for connecting the probing head to ground is also generally included in the probing head. Ground provides the electrical reference point for other signal measurements, so the ground connection typically remains unchanged while the probing head is moved around to make signal measurements.

Electrical test probes are used to provide an electrical connection between electrical components and testing instruments such as oscilloscopes and other measuring, monitoring, diagnostic, and signal processing instruments. As shown in FIG. 1, a traditional test probe tip is an elongate conductive member that terminates in a conical, blunt, or rounded point.

When a test probe contacts a pin or lead on an electrical device to be tested, it forms an electrical connection therewith. The electrical signal on the pin may then be measured, monitored, or otherwise processed. It is difficult to form a contact with a single pin on a modem integrated circuit chip ("IC") with a traditional test probe tip because miniaturization has resulted in close spacing of the pins. If two adjacent pins are contacted simultaneously by the test probe tip, a short circuit may result between the two adjacent pins. A short circuit may prevent measurement of the desired signal and may result in damage to the internal circuitry of the IC. A traditional test probe tip provides no means for preventing the occurrence of a short circuit.

IC grabber probes that enable connection to small IC legs or small connection points are well known. These grabber probes have a jaw-like tip that connects and holds a pin. These grabber probes, however, are relatively stiff and prevent optimum positioning of probing heads.

Tektronix produces a signal-ground adapter that has been specifically designed to connect with a square pin. But like the IC grabber probes, the signal-ground adapter connects rigidly to signal and ground pins, and the inflexibility prevents desirable movement of the probing head to optimum positions. Tektronix also produces a right-angle adapter that includes a stiff coil used to rigidly attach a probe at a right angle to a pin. The purpose of the stiff coil is to mate with a pin, and the stiffness prevents movement of the probe. Because it is inflexible after mating with the pin, the coil is not adaptable and may be used in only one position for probing a specific type of pin (a 0.025 inch diameter square pin). Tektronix also produces a "Y-lead" adapter having wire leads that may be combined with the right-angle adapter. The combination of the right-angle adapter and the Y-lead adapter may allow the probing head to be moved relative to the device being probed, but the addition of leads may add inductance. Probing an electrical device using the Y-lead adapter may be inconvenient or impossible, using just one hand. Typically, the probe body must be laid on the table while pin connections are changed. Draping the wire leads on electrical components and moving parts, such as a CPU fan, is another disadvantage of the Y-lead adapter.

Several prior art references are directed to electrical test probe tips and electrical connectors. U.S. Pat. No. 4,978,312 to Fodali (the "Fodali reference") is directed to a tip attachment for a circuit test probe and, specifically, to a spring attachment for placement on a handheld tester with an ice pick type probe. One end of the tapered spring tip attachment fits on the ice pick type probe, and the other end terminates in a straight length of wire. The purpose of this spring attachment is to provide a smaller gauge tip for insertion into sockets too small for the ice pick probe. In other words, the Fodali tip uses a spring merely as a connector for attaching the straight wire probe end to a tapered ice pick type probe.

U.S. Pat. No. 3,885,848 to Brouneus (the "Brouneus reference") is directed to a method of making an electrical connection with a flat surface contact using a conical spring. The contact member is a conically spiraled length of electrically conductive resilient wire including spirals which progressively increase in size. A cylindrical helix is electrically connected to the small end of the volute helix. An electrically conductive terminal member may be inserted into and secured within the cylindrical helix. The wide end of the conical spring may be electrically connected to a flat conductive surface. Compressing the volute helix moves the spirals of the helix into contact with a flat surface.

BRIEF SUMMARY OF THE INVENTION

The present invention is directed to a flexible spring tip for a probe-type electrical tester. Preferably the flexible spring tip has a conductive flexible spring having a first end and a second end. The flexible spring allows movement and repositioning of a probe head while a stable connection is maintained with a circuit test point. Multiple electrical test probe spring tips may be used to simultaneously probe signal and ground reference points. The first end of the flexible spring is for flexibly coupling with a device to be probed. Various alternate embodiments of the first end of the flexible spring tip may include an enlarged coil, a hooked end, a foot end, a clip, or any other means of coupling with a device to be probed.

The second end of the flexible spring tip may be integral with the probe head or may have a connector attachable to any type of probe head.

The present invention also includes a method for using the above mentioned flexible spring tip.

One preferred embodiment of the present invention solves the problem of lack of circuit board visibility. During testing with the present invention, a user may move the probe head for better visibility of the circuit board. An alternate preferred embodiment of the present invention also solves the problem of positioning two probe heads adjacent to each other when testing closely spaced test points.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 15 is a flowchart of an exemplary method of using the present invention.

DETAILED DESCRIPTION OF THE INVENTION

The present invention is a flexible spring tip 8 for a probe-type electrical tester. A general preferred embodiment of the flexible spring tip 8 of the present invention includes a flexible coil, tube, or spring 10 having a first end and a second end. The first end of the flexible spring 10 is for coupling with a device to be probed. A connector, such as a connecting pin 12, clip 12', or integral connector 12" FIG. 4), positioned at the second end of the flexible spring 10.

Figure 1:
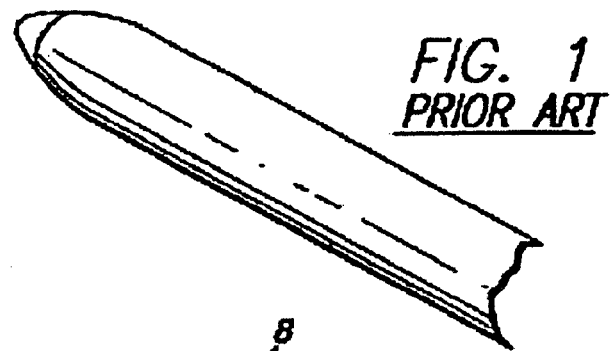
FIG. 1 is a perspective view of a prior art probing tip.
Figure 2:
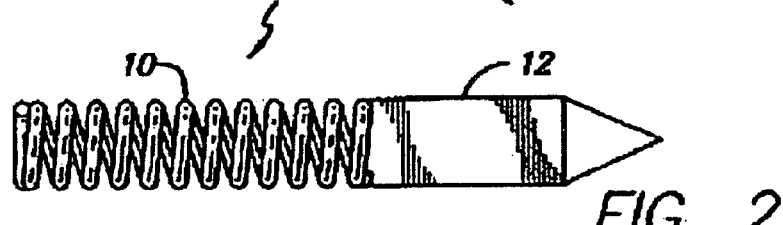
FIG. 2 shows a first preferred embodiment of the flexible spring tip of the present invention.

FIG. 2 shows a first preferred embodiment of the flexible spring tip 8 of the present invention. This embodiment is the most general of the embodiments as it has only a flexible spring 10 with a diameter that is substantially equal throughout the longitudinal axis.

Figure 3:
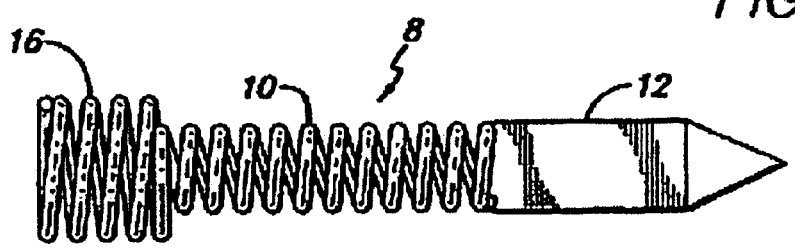
FIG. 3 shows a second preferred embodiment of the flexible spring tip of the present invention.

FIG. 3 shows a second preferred embodiment of the flexible spring tip 8 of the present invention having an enlarged coil 16 at the first end of the flexible spring 10. The enlarged coil 16 may be used to contact a device to be probed. This embodiment is particularly suited for coupling with square pins, through-hole pins, and protruding test points.

Figure 4:
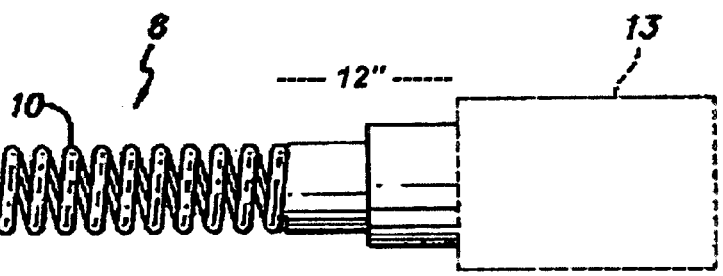
FIG. 4 shows a third preferred embodiment of the flexible spring tip of the present invention.

FIG. 4 shows a third preferred embodiment of the flexible spring tip 8 of the present invention having a hook 18 at the first end of the flexible spring 10. This embodiment is particularly suited for coupling with IC leads, resistor leads, and bare wires. For example, the hook 18 can be used to "catch" the IC leads, resistor leads, and bare wires. If a more permanent connection is desired, the hook 18 can be crimped or otherwise closed.

Figure 5:
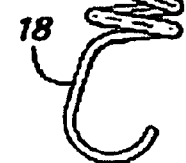
FIG. 5 shows a fourth preferred embodiment of the flexible spring tip of the present invention.
Figure 5:
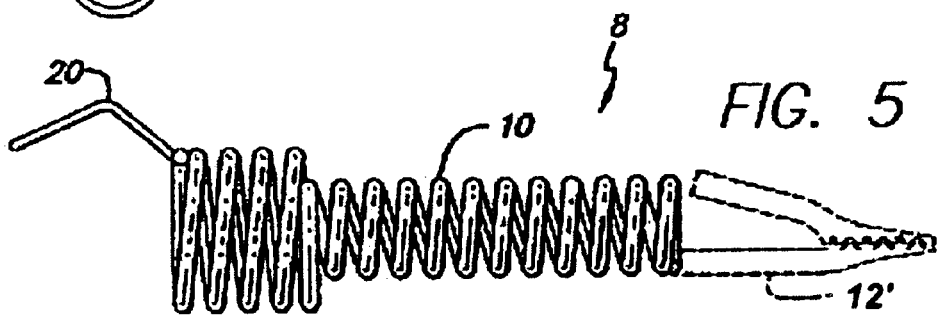

FIG. 5 shows a fourth preferred embodiment of the flexible spring tip 8 of the present invention having a foot 20 at the first end of the flexible spring 10. The foot 20 may be an extended bent piece of wire or a specially designed foot such as a spike or wedge. This embodiment may also combined with the shown enlarged coil or alternatively, the foot may be used with a flexible spring 10 having a diameter that is substantially equal throughout the longitudinal axis. This embodiment is particularly suited for coupling with leads of an IC or catching on protruding connection sites. The connector on the second end of the flexible spring 10 is shown as a clip 12'.

Figure 6:
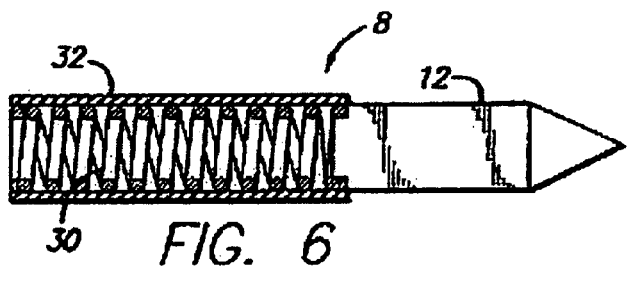
FIG. 6 shows a fifth preferred embodiment in which the spring tip of the present invention is enclosed in a conductive sheath.

FIG. 6 shows a fifth preferred embodiment of the flexible spring tip 8 of the present invention in which a flexible spring 30 is surrounded or coated with a flexible conductive sheath 32 to reduce inductance of the flexible spring 30. This embodiment may also incorporate the enlarged end shown in FIG. 3, the hook shown in FIG. 4, or the foot shown in FIG. 5.

Figure 7:
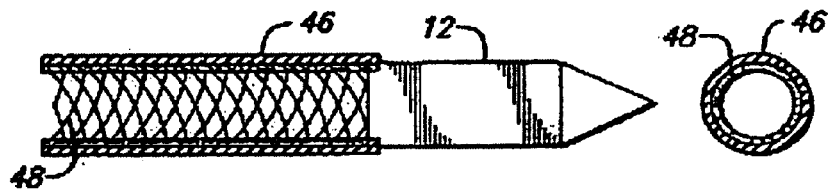
FIG. 7 shows a sixth preferred embodiment in which a spring or other flexible conductor is surrounded by an insulating sheath to protect against short circuits.
Figure 8:
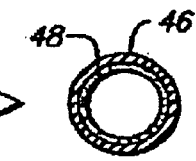
FIG. 8 is an end view of the embodiment of FIG. 7.

FIGS. 7 and 8 show a sixth preferred embodiment of the flexible spring tip 8 of the present invention in which the flexible spring is externally surrounded or coated with an insulating sheath 46 or insulating paint or enamel to protect against short circuits. Alternately, the spring may be replaced with a tube of insulating material (such as insulating rubber) lined internally with conductive flexible material 48 (such as a coax braid or foil). This embodiment may also incorporate the enlarged end 16, hook 18, or foot 20 as discussed above.

Figure 9:
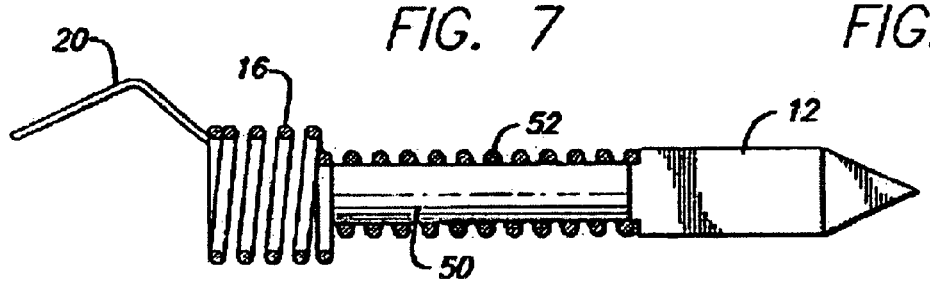
FIG. 9 shows a seventh preferred embodiment in which a conductive elastomer is disposed through the center of the spring tip to eliminate inductance.
Figure 10:
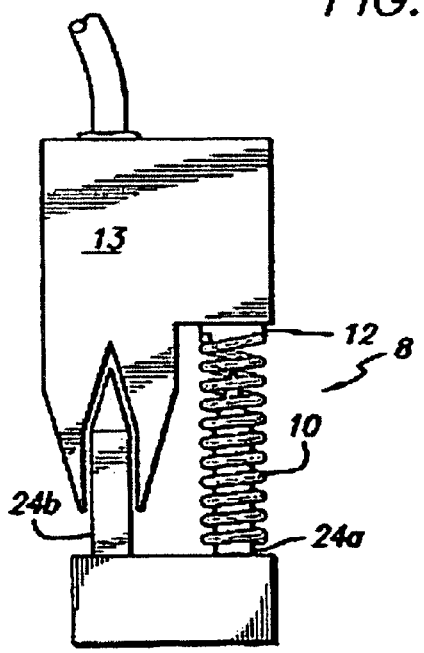
FIGS. 10–14 show applications for which the flexible spring tip of the present invention may be used.

FIG. 9 shows a seventh preferred embodiment of the flexible spring tip 10 of the present invention in which a conductor disposed at least part way through the axial center of the flexible spring tip may be used to eliminate inductance that may be produced by the coils of the flexible spring 10. In the shown exemplary embodiment a conductive elastomer 50 is disposed through the axial center of the spring 52 to eliminate inductance. In the shown embodiment there is an enlarged end 16 and a foot 20, however, these features are optional and other ends may be used.

Alternate variations of the present invention use combinations of the aforementioned embodiments or additional variations on the ends. Multiple electrical test probe spring tips may be used to simultaneously probe any number of signal and ground reference points. Also, one or more electrical test probe spring tips may be used in combination with other types of probe tips. For example, the electrical test probe spring tip may be connected to ground so as to allow the second tip to be moved from place to place.

As mentioned, a connector is at the second end of the flexible spring 10. Most of the embodiments show a connecting pin 12 as the connector at the second end of the flexible spring 10. The connecting pin 12 is meant to be exemplary and any connector suitable for attaching to a probing head 13, signal socket 48, or grounding socket 22, may be used. The connecting pin 12 may be adapted to interact with any type of probe head (shown as probing head 13 in FIGS. 10–14). In the preferred embodiment shown in FIG. 2, the connecting pin 12 has a square cross section. A spring socket, clip 12' (FIG. 5), or other type of connector may be used in place of the connecting pin 12. Alternately, the flexible spring tip 8 may be integral (possibly using an integral connector 12") with the probing head 13 as shown in FIG. 4.

FIGS. 10–14 show several methods using the flexible spring tip 8 of the present invention. These examples are meant to be exemplary and are not meant to limit the scope of the invention.

Figure 11:
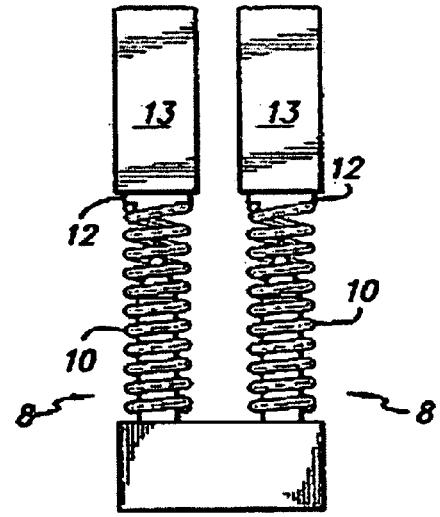
Figure 12:
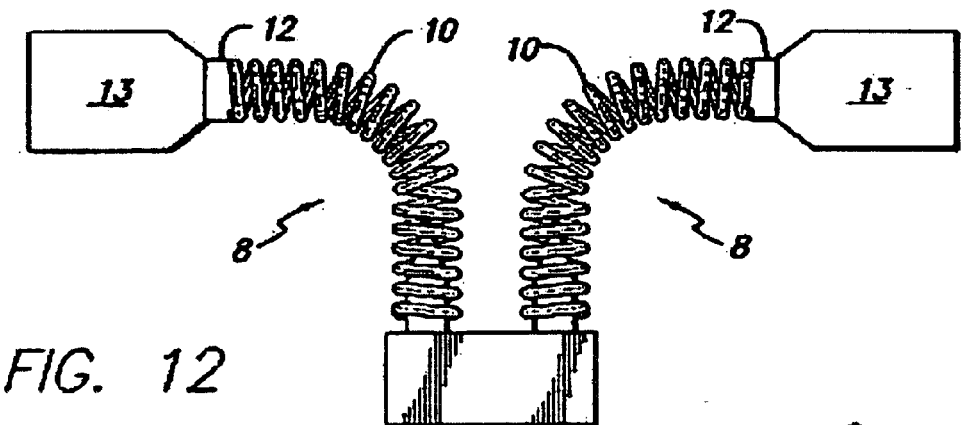

Since probe heads are generally much larger than test tips, the probe heads block visibility. It may be difficult to see the test tip and the circuit board when trying to mate the test tip to a test point on the circuit board. In FIGS. 11 and 12, flexible spring tips 8 solve the problem of circuit board visibility by allowing the user to move one or more probe heads 13 for better visibility of the circuit board.

The flexible spring tip 8 also solves the difficult problem of positioning two probe heads adjacent to each other. Miniaturization of devices and components to be probed and the relatively large size of probe heads makes it difficult to use two probe heads to connect with two adjacent leads or test points. As shown in FIG. 12, the flexible spring tip 8 solves this problem by allowing at least one probe head connected to a test point to be easily moved to make room for adjacent probes.

Figure 13:
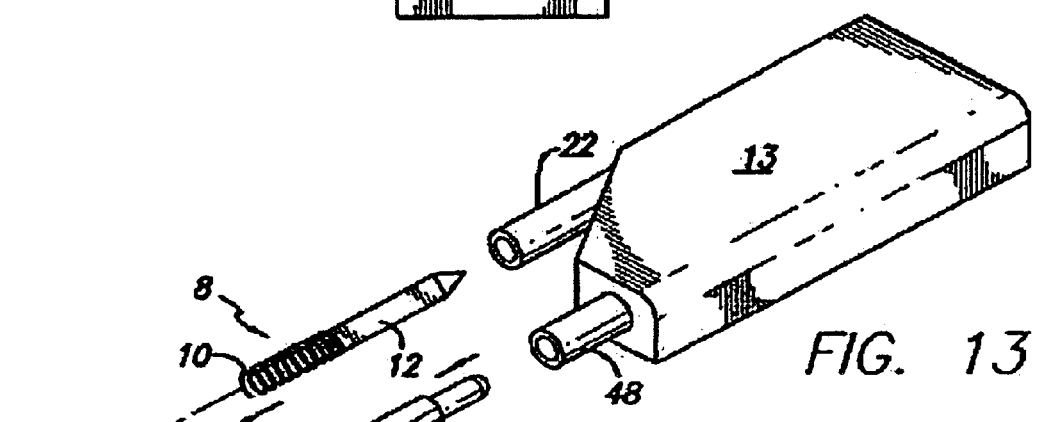

In addition to being used to probe a signal path, FIG. 13 shows a flexible spring tip 8 used as a grounding connector. The connecting pin 12 is inserted into the grounding socket 22. The flexible spring 10 is then attached to a first pin 24a (such as a 0.100 inch header pin). A second probe tip 26 inserted into the signal socket 48 may then be connected to a second pin 24b. The flexible spring tip allows ground and signal connection to a first pin 24a and a second pin 24b that may be set at various distances from each other.

Figure 14:
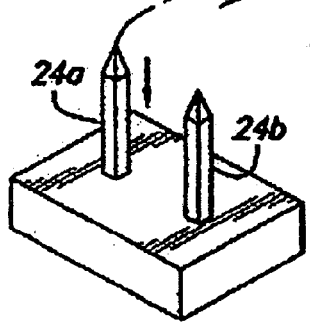
Figure 14:
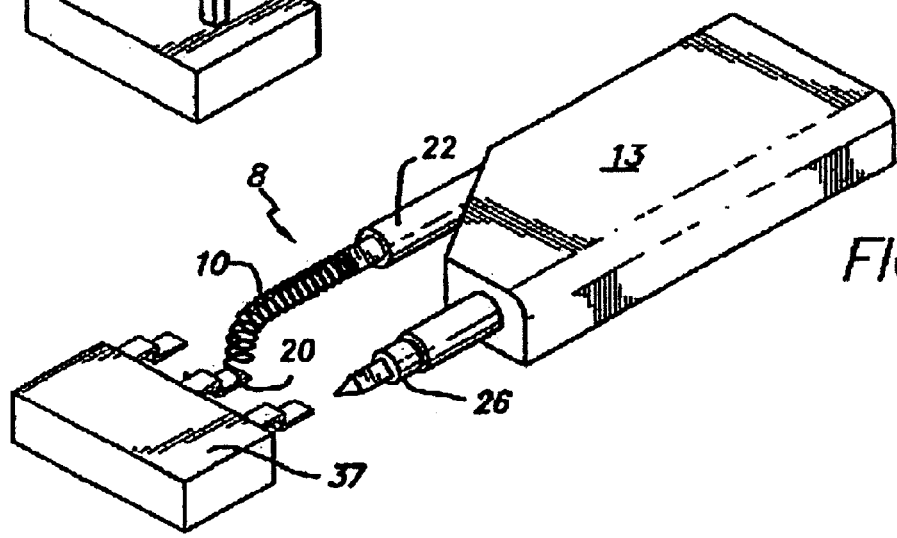

FIG. 14 shows an embodiment of the flexible spring tip 8 with a foot 20 (see also FIG. 9) that is particularly suited for attachment to the leads of an IC device. The flexible spring tip 8 may be attached to a grounding lead. The second probe tip 26 may then probe one or more other leads of the IC device 37. In other words, one flexible spring tip 8 may act as a grounding lead allowing the probing head to move and reach a plurality of leads.

It should be noted that the flexible spring 10 may be a coil, tube, or even a solid flexible member with a hollowed portion at the first end for coupling with a device to be probed. Alternate flexible members are contemplated within the scope of the invention.

Methods for making and using the flexible spring tip are also contemplated in the invention. A method for using a multipurpose electrical test probe having a probing head and flexible tip may include attaching a connector end of the flexible tip to the probing head 54. This step would be optional as the flexible tip may also be permanently connected to the probing head. The contact end of the flexible tip may then be placed in electrical contact with an electrical component or ground reference point to be probed 56. The flexible tip may be flexed 58 while in electrical contact with an electrical component or ground reference point so as to allow movement of the probing head for electrical, mechanical, and visual access to nearby components and reference points 60. Electrical and mechanical access to nearby components may include making additional electrical connections with other flexible tips on the same probing head 62, introducing at least one other probing head having its own flexible tip(s) 64, introducing other test equipment 66, or using other electrical or mechanical tools in the access space provided by flexing the tip 68. The methods of using the present invention may include the option of making at least one flexible or inflexible electrical ground connection because most ICs have a ground pin and the majority of electrical measurements use ground as an electrical reference point 70.

The terms and expressions that have been employed in the foregoing specification are used as terms of description and not of limitation and are not intended to exclude equivalents of the features shown and described or portions of them. The scope of the invention is defined and limited only by the claims that follow.

What is claimed is:

1. An electrical test probe tip for use with a probing head, comprising:
   (a) a conductive flexible coil having a first end and a second end;
   (b) said first end for coupling with a device to be probed;
   (c) a discrete connector attached to said second end of said conductive flexible coil with substantially no overlap between said connector and said second end of said flexible coil; and
   (d) said connector for connecting to said probing head.

2. The electrical test probe tip of claim 1, said connector being a connecting pin coupleable to said probing head.

3. The electrical test probe tip of claim 1, said connector being a square pin coupleable to said probing head.

4. The electrical test probe tip of claim 1, said connector being in integral connection with said probing head.

5. The electrical test probe tip of claim 1, said flexible coil having a longitudinal axis and a first diameter, said first diameter being substantially equal throughout said longitudinal axis of said flexible coil.

6. The electrical test probe tip of claim 5, said first end having a second diameter larger than said first diameter.

7. The electrical test probe tip of claim 1, said first end further comprising a hook.

8. The electrical test probe tip of claim 1, said first end further comprising a foot.

9. The electrical test probe tip of claim 1 further comprising an exterior conductive sheath at least partially surrounding said conductive flexible coil.

10. The electrical test probe tip of claim 1 further comprising an exterior insulating sheath at least partially surrounding said conductive flexible coil.

11. The electrical test probe tip of claim 1 further comprising a conductor disposed at least partially through the axial center of said conductive flexible coil.

12. The electrical test probe tip of claim 11, wherein said conductor is made of a conductive elastomer.

13. A multipurpose electrical test probe tip, comprising:
   (a) a conductive flexible member and having a longitudinal length;
   (b) said flexible member having a first end at a first end of said longitudinal length and a second end at a second end of said longitudinal length;
   (c) said flexible member being substantially hollow at said first end;
   (d) a discrete connector;
   (e) said connector being connected to said second end of said flexible member with substantially no overlap;
   (f) said flexible member being flexible along substantially the entire longitudinal length of said flexible member when interconnected with said connector.

14. The multipurpose electrical test probe tip of claim 13, wherein said second end of said conductive flexible member is interconnectable with said probing head.

15. The multipurpose electrical test probe tip of claim 14, wherein said second end of said conductive flexible member is integral with said probing head.

16. The multipurpose electrical test probe tip of claim 14, said second end of said conductive flexible member further comprising a connector coupleable with said probing head.

17. The multipurpose electrical test probe tip of claim 13, said flexible member having a longitudinal axis and a first diameter, said first diameter being substantially equal throughout said longitudinal axis of said flexible coil.

18. The multipurpose electrical test probe tip of claim 17, said first end having a second diameter larger than said first diameter.

19. The multipurpose electrical test probe tip of claim 13, said first end further comprising a hook.

20. The multipurpose electrical test probe tip of claim 13, said first end further comprising a foot.

21. The multipurpose electrical test probe tip of claim 13 further comprising an exterior conductive sheath at least partially surrounding said conductive flexible member.

22. The multipurpose electrical test probe tip of claim 13 further comprising an exterior insulating sheath at least partially surrounding said conductive flexible member.

23. The multipurpose electrical test probe tip of claim 13 further comprising a conductor disposed at least partially through the axial center of said conductive flexible member.

24. The electrical test probe tip of claim 1, said conductive flexible coil being substantially hollow at said first end.

25. The electrical test probe tip of claim 1, said conductive flexible coil being substantially hollow.

26. The electrical test probe tip of claim 1, said first end of said conductive flexible coil being suitable to receive a device to be probed therein.

27. The electrical test probe tip of claim 1, wherein said first end of said conductive flexible coil at least partially surrounds a device to be probed.

28. The multipurpose electrical test probe tip of claim 13, said conductive flexible member being substantially hollow.

29. The multipurpose electrical test probe tip of claim 13, said first end of said conductive flexible member being suitable to receive a component to be probed therein.

30. The multipurpose electrical test probe tip of claim 13, wherein said first end of said conductive flexible member at least partially surrounds a component to be probed.

31. The electrical test probe tip of claim 1, said first end of said flexible coil having at least one additional coupling mechanism extending therefrom, said additional coupling mechanism selected from the group consisting of:
   (a) an enlarged coil having a diameter larger than the diameter of said flexible coil;
   (b) a hook; and
   (c) a foot.

32. The electrical test probe tip of claim 13, said first end of said flexible coil having at least one additional coupling mechanism extending therefrom, said additional coupling mechanism selected from the group consisting of:
   (a) an enlarged coil having a diameter larger than the diameter of said flexible coil;
   (b) a hook; and
   (c) a foot.

33. An electrical test probe tip, comprising:
   (a) a conductive flexible coil having a first end and a second end, said first end opposite said second end;
   (b) a connector;
   (c) said first end of said conductive flexible coil for coupling with a device to be probed; and
   (d) said connector attached to the extreme second end of said conductive flexible coil with substantially no overlap between said conductive flexible coil and said connector.

34. The electrical test probe tip of claim 33, said conductive flexible coil having a longitudinal length, said conductive flexible coil being flexible along substantially said entire longitudinal length of said conductive flexible coil when interconnected with said connector.

35. A multipurpose electrical test probe tip interconnectable with a probing head, comprising:
   (a) a conductive flexible member and having a longitudinal length;
   (b) a discrete connector.
   (c) said flexible member having a first end at a first end of said longitudinal length and a second end at a second end of said longitudinal length;
   (d) said flexible member being substantially hollow at said first end;
   (e) said connector being connected to said second end of said flexible member with substantially no overlap;
   (f) said flexible member being flexible along substantially the entire longitudinal length of said flexible member when interconnected with said connector.

36. The multipurpose electrical test probe tip of claim 35, said connector attached to said second end of said conductive flexible member with minimal overlap between said connector and said second end of said conductive flexible member.

37. The multipurpose electrical test probe tip of claim 35, said connector attached to the extreme end of said second end of said conductive flexible member.

* * * * *

UNITED STATES PATENT AND TRADEMARK OFFICE
CERTIFICATE OF CORRECTION

PATENT NO. : 6,863,576 B2
DATED : March 8, 2005
INVENTOR(S) : Julie A. Campbell and Lawrence W. Jacobs It is certified that error appears in the above-identified patent and that said Letters Patent is hereby corrected as shown below:

Column 1,
Line 42, "modem" should be -- modern --.

Column 3,
Line 38, "12" FIG." should be -- 12" (FIG. --.
Line 39, "4), positioned" should be -- 4), is positioned --.

Column 8,
Line 22, "connector." should be -- connector; --.

Signed and Sealed this

Twenty-second Day of November, 2005

JON W. DUDAS
*Director of the United States Patent and Trademark Office*